US008405411B2

(12) United States Patent
Fernández Llona et al.

(10) Patent No.: US 8,405,411 B2
(45) Date of Patent: Mar. 26, 2013

(54) CONTROL METHOD FOR AN INDUCTION APPARATUS, AND INDUCTION APPARATUS

(75) Inventors: Gonzalo José Fernández Llona, Elorrio (ES); Javier Rubiales Garrido, Mondragón (ES)

(73) Assignee: Coprecitec, S.L., Aretxabaleta (Gipuzkoa) (ES)

( * ) Notice: Subject to any disclaimer, the term of this patent is extended or adjusted under 35 U.S.C. 154(b) by 272 days.

(21) Appl. No.: 12/850,614

(22) Filed: Aug. 4, 2010

(65) Prior Publication Data

US 2011/0031989 A1 Feb. 10, 2011

(30) Foreign Application Priority Data

Aug. 5, 2009 (EP) .................................... 09380143

(51) Int. Cl.
*G01R 27/28* (2006.01)

(52) U.S. Cl. ......................... 324/712; 324/654; 324/713

(58) Field of Classification Search .................. 324/654, 324/712, 713, 76.11; 219/661, 663
See application file for complete search history.

(56) References Cited

U.S. PATENT DOCUMENTS

2010/0006563 A1* 1/2010 Schilling et al. .............. 219/661

FOREIGN PATENT DOCUMENTS

EP 1935214 A2 6/2008

OTHER PUBLICATIONS

Extended European Search Report; 09380143; May 26, 2010.

* cited by examiner

*Primary Examiner* — Vincent Q Nguyen
(74) *Attorney, Agent, or Firm* — Tim L. Kitchen; Peter B. Scull; Hamilton, DeSanctis & Cha LLP

(57) ABSTRACT

A method for controlling an induction apparatus having an induction coil. In one implementation the induction apparatus includes a capacitor that is connected in parallel with the induction coil to form a parallel resonant circuit, and also includes a switch connected in series with the parallel resonant circuit, between the parallel resonant circuit and a reference voltage. According to one method, a digital test signal dependent on the voltage in a node disposed between the switch and the parallel resonant circuit is generated, the switch is closed for a predetermined closure time and then reopened at the end of the closure time. With the switch reopened, the test signal is evaluated for a predetermined waiting time in order to determine the presence or absence of a vessel on the induction coil.

19 Claims, 3 Drawing Sheets

CONTROL METHOD FOR AN INDUCTION APPARATUS, AND INDUCTION APPARATUS

CROSS-REFERENCE TO RELATED APPLICATIONS

The present application relates to and claims the benefit of European Patent Application No. 09380143.9 filed Aug. 5, 2009.

TECHNICAL FIELD

The present invention relates to a control method for an induction apparatus, and more specifically to a method for detecting a vessel in an induction apparatus. The invention also relates to an induction apparatus adapted to carry out said method.

BACKGROUND

Induction apparatuses comprise at least one induction surface upon which a vessel may be disposed and heated, said apparatuses comprising at least one induction coil disposed beneath the induction surface in order to heat said vessel. To heat the vessel, the induction coil is supplied by an alternating current. A magnetic field is generated as a result and this causes the generation of eddy currents through the vessel disposed on the induction surface, said eddy currents causing said vessel to heat up.

There are various known alternatives for supplying the induction coil, the majority of which include a rectifier and a frequency converter for the rectified signal. The frequency converter generally comprises at least one switch, and in many cases a single switch is used, this being connected in series with a parallel resonant circuit formed by the induction coil and a capacitor.

The drawback with this alternative is that it may cause the system to overheat or become damaged due to the use of a vessel made of an unsuitable material such as aluminium, for example, a material which offers high inductance and low resistance. It is important, therefore, that the induction apparatus includes a method capable of detecting the presence or absence of said vessel, and/or the quality (resistivity) (or size) of said vessel, the purpose being not to supply said induction coil with power when no vessel is disposed on the induction surface for example, or to supply it with power that is insufficient for the size or resistivity of the vessel disposed on said surface.

European Patent Application published as EP1935214A2 discloses an induction apparatus that comprises a method for detecting a vessel. In this method the voltage in an intermediate node between the switch and the parallel resonant circuit formed by a capacitor and the induction coil is determined, and it is important to close the switch when the voltage in the intermediate node reaches a minimum point and for a time interval determined by the voltage in said minimum point. The closure of the switch generates oscillations in the voltage of the intermediate node, and the presence or absence of the vessel is determined in accordance with the number of oscillations detected.

SUMMARY

A control method of the invention is used to detect a vessel disposed on an induction apparatus. Said apparatus comprises at least one induction coil, upon which a vessel may be disposed and heated, at least one capacitor connected in parallel with the induction coil, said induction coil and the capacitor forming a parallel resonant circuit, and at least one switch connected in series with the parallel resonant circuit, between said parallel resonant circuit and a reference voltage.

In a method of the invention, a digital test signal dependent on the voltage in an intermediate node disposed between the switch and the parallel resonant circuit is generated, the switch is closed during a predetermined closure time, said switch is opened at the end of said closure time, and, with the switch opened, the test signal is evaluated during a maximum predetermined waiting time in order to determine the presence or absence of a vessel on the induction coil. The test signal comprises a first digital logic level when the voltage in the intermediate node is greater than a predetermined reference value and a second digital logic level when said voltage is smaller than said reference value, and the presence of a vessel is determined if, during its evaluation, the test signal maintains its digital logic level.

As a result, when a digital test signal dependent on the voltage in an intermediate node disposed between the switch and the parallel resonant circuit is generated and when a vessel is detected by means of the evaluation of said test signal, it is sufficient to wait, at the most, a determined waiting time in order to carry out said detection, it being evaluated whether said test signal has changed its digital logic level or not, without strict limitations such as the moment of closure of the switch or the duration of said closure, which may be selected arbitrarily by the manufacturer.

These and other advantages and characteristics of the invention will be made evident in the light of the drawings and the detailed description thereof.

DETAILED DESCRIPTION

Figure 1:
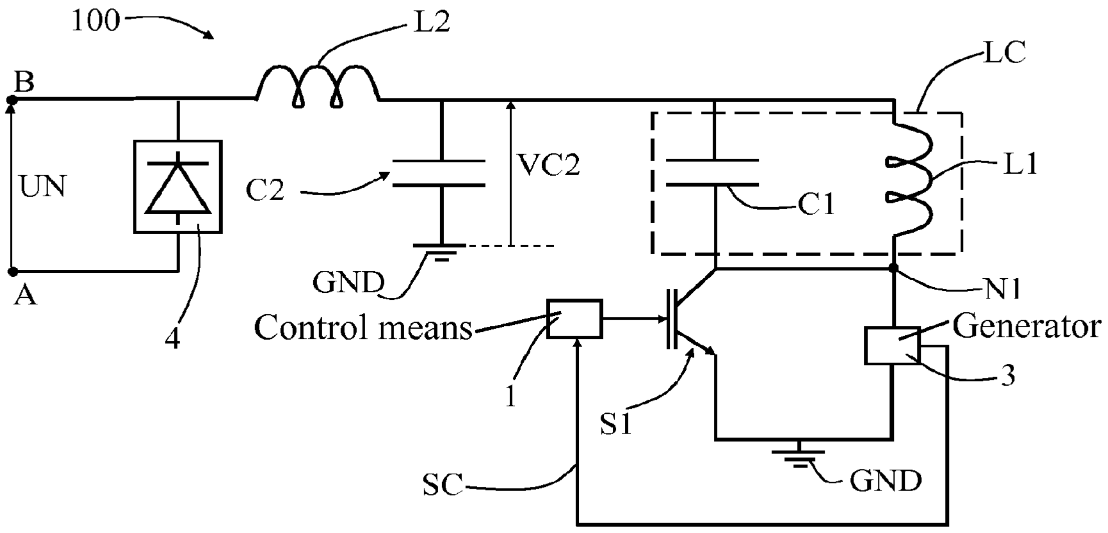
FIG. 1 shows an induction circuit of an embodiment of an induction apparatus of the invention.
Figure 2:
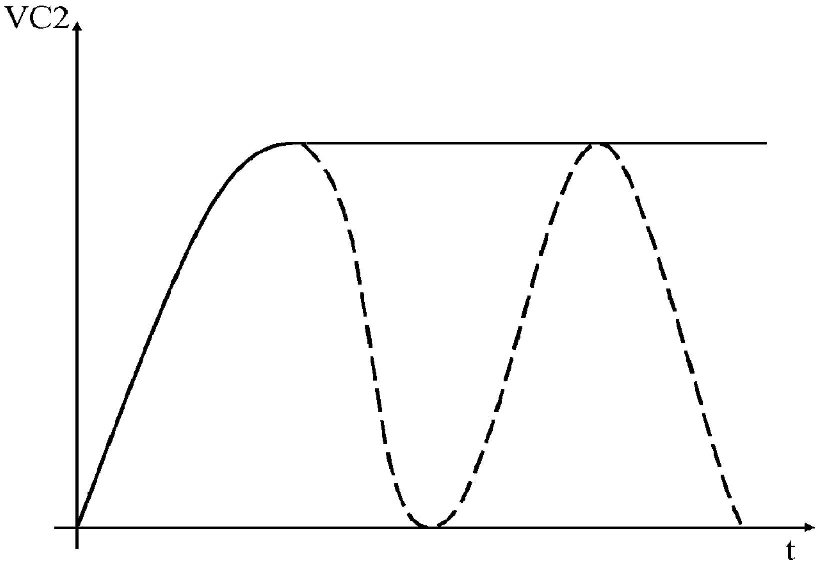
FIG. 2 shows a development of the voltage of a second capacitor of the induction circuit of FIG. 1.

The control method of the invention is adapted to detect the presence of a vessel (not shown in the figures) in an induction apparatus (not shown in the figures), and as a result it detects whether a vessel has been disposed on an induction surface (not shown in the figures) of said apparatus. With reference to FIG. 1, In one implementation the apparatus comprises an induction circuit 100 with at least one induction coil L1, upon which the induction surface is disposed, at least one capacitor C1 connected in parallel with the induction coil L1, said induction coil L1 and the capacitor C1 forming a parallel resonant circuit LC, and at least one switch S1, preferably an IGBT (Insulated Gate Bipolar Transistor), connected in series with the parallel resonant circuit LC between said parallel resonant circuit LC and a reference voltage GND. The induction circuit 100 also comprises two terminals A and B for the reception of an alternating voltage UN, a bridge rectifier 4 to rectify the alternating voltage UN, a filter formed by a coil L2, and a second capacitor C2 that is charged with a capacitor voltage VC2, as shown in FIG. 2, when the circuit is supplied with the alternating voltage UN and the switch S1 is opened (the continuous line in said FIG. 2), and when the circuit is supplied with said alternating voltage UN and said switch S1 is closed (broken lines in said FIG. 2).

Figure 3A:
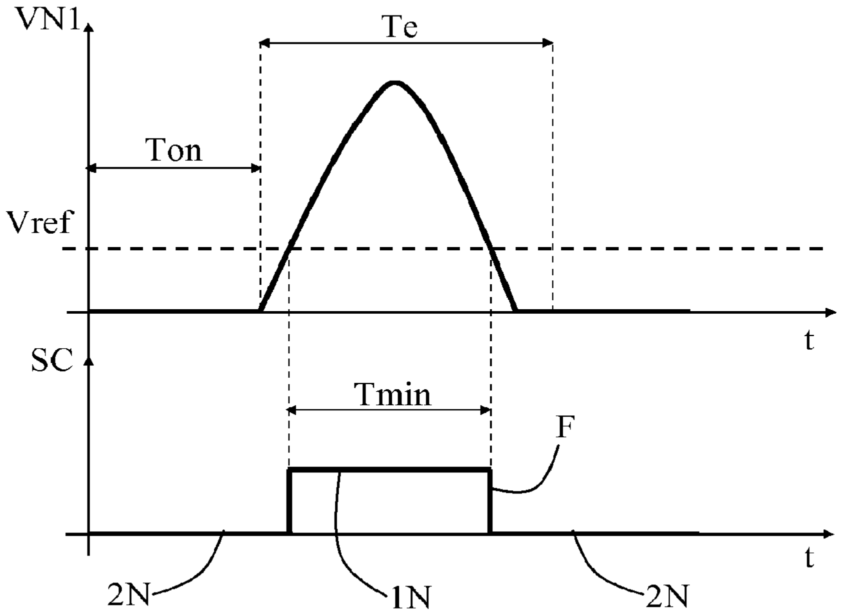
FIG. 3*a* shows the development of a test signal of a method of the invention, when there is no vessel disposed on the induction coil of the circuit of FIG. 1.
Figure 3B:
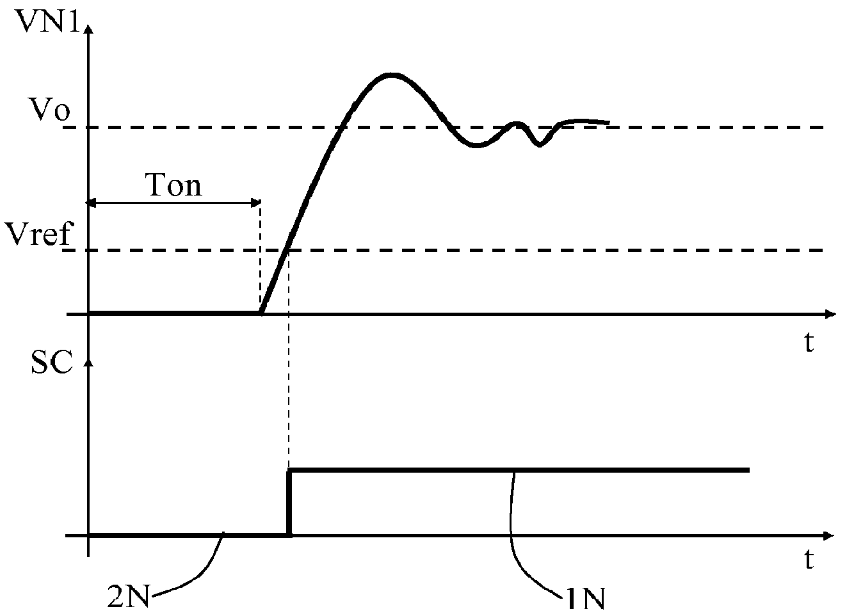
FIG. 3*b* shows the development of a test signal of a method of the invention, when there is a vessel disposed on the induction coil of the circuit of FIG. 1.

In a first moment, when the induction circuit 100 is supplied with an alternating voltage UN, the switch S1 is preferably open. The method of the invention also involves the generation of a digital test signal SC dependent on a voltage VN1 present in an intermediate node N1 disposed between the switch S1 and the parallel resonant circuit LC. The test signal SC comprises a first digital logic level 1N when the tension VN1 in the intermediate node N1 is greater than a predetermined reference value Vref, and a second digital logic level 2N when said voltage VN1 is smaller than said reference value Vref, as shown in FIGS. 3*a* and 3*b*. To detect the presence or absence of a vessel, the switch S1 is closed for a predetermined closure time Ton, which may be approximately four micro-seconds, for example, but which may also be longer or shorter depending on the manufacturer's requirements, and is opened at the end of the closure time Ton. Once the switch S1 is opened again, the test signal SC is evaluated during, at the most, a predetermined waiting time Te to determine the presence or absence of a vessel on the induction surface of the apparatus, it being determined that a vessel is disposed on the induction surface if, during the waiting time Te, the test signal SC maintains its digital logic level. If, on the other hand, during said waiting time Te said test signal SC changes its digital logic level, it is determined that no vessel is disposed on the induction surface.

FIG. 3*a* shows an example of the voltage VN1 in the intermediate node N1, with no vessel disposed on the induction surface. During the closure time Ton, the voltage VN1 in the intermediate node N1 is substantially equal to zero as the switch S1 connects said intermediate node N1 to the reference voltage GND. When the closure time Ton ends, the switch S1 is opened and the voltage VN1 shows a sinusoidal behaviour. Due to said behaviour the value of the voltage VN1 falls after reaching a maximum point, which in the event of the absence of a vessel can fall to approximately zero volts (the value then increases again, being stabilized in a specific offset value Vo greater than the reference value Vref. When the voltage N1 rises above the reference value Vref, the test signal SC comprises the first digital logic level 1N, and in the event that no vessel is disposed on the induction surface, when the voltage VN1 reaches the reference value Vref the test signal SC moves to the second digital logic level 2N, changing its digital logic level.

FIG. 3*b* shows the voltage VN1 in the intermediate node N1, with a vessel disposed on the induction surface. During the closure time Ton, the voltage VN1 is substantially equal to zero as the switch S1 connects the intermediate node N1 to the reference voltage GND. When the closure time Ton ends, the switch S1 is opened and the voltage VN1 shows a sinusoidal behaviour, with the result that its value falls after reaching a maximum point. When a vessel is disposed on the induction surface, due to the fact that the vessel modifies the impedance of the induction coil L1, the voltage VN1 being stabilised directly at the offset value Vo, with a certain oscillation dependent on the closure time Ton and the resistance of the vessel. The manufacturer pre-selects the predetermined reference value Vref in order to bring about the change in the digital logic level of the test signal SC that is smaller than the offset value Vo, with the result that when a vessel is disposed on the induction surface, the voltage VN1 does not fall to the reference value Vref, remaining instead at a greater value (offset value Vo), and the test signal SC maintains its digital logic level. The test signal SC comprises the first digital logic level 1N when the voltage VN1 rises above the reference value Vref. When said voltage VN1 decreases again, said voltage VN1 does not fall below the reference value Vref and the test signal SC continues to maintain its first digital logic level 1N, it being possible to determine the presence of a vessel when the digital logic level of the test signal SC remains constant.

Figure 3C:
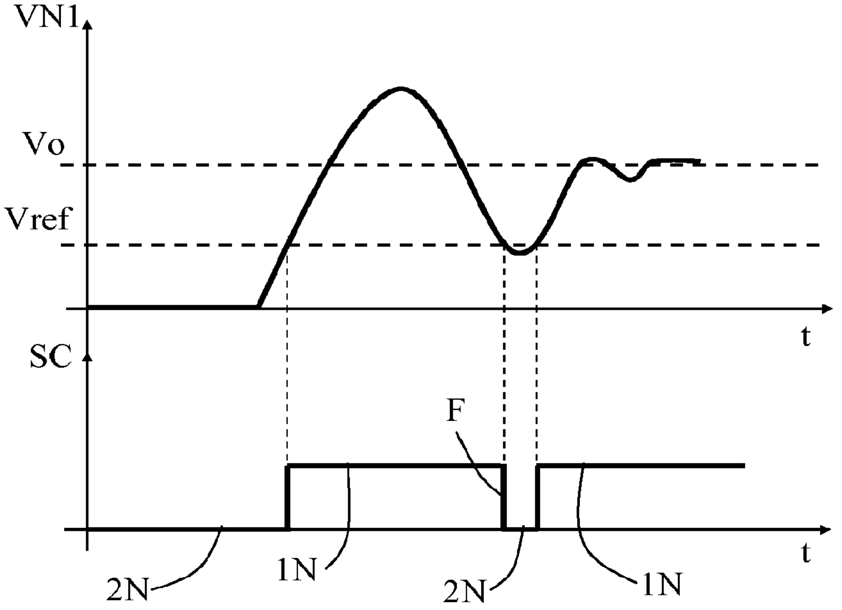
FIG. 3*c* shows the development of a test signal of a method of the invention, with the quality and/or size of a vessel disposed on the induction coil of the circuit of Figure being detected.

If the level of the test signal SC does not change, the presence of a vessel is determined but its size and/or quality cannot be determined. A control method is also adapted to determine said size and/or quality. When said presence is detected, the voltage VN1 remains stable at the offset value Vo but comprises a plurality of oscillations, as shown in FIG. 3*b*. The amplitude of the oscillations depends on the resistance of the vessel and closure time Ton applied to the switch S1, with the result that the method of the invention may repeat the steps of closing the switch S1 for a time interval Ton greater than the previous time interval Ton, opening said switch S1 at the end of the corresponding closure time Ton, and, with the switch S1 opened, evaluating the test signal SC in order to determine whether the test signal SC maintains its digital logic level during the waiting time Te, to evaluate when the oscillation is of an amplitude that reaches the reference value Vref thereby causing the test signal SC to change its digital logic level, as shown in FIG. 3*c*. The greater the closure time Ton necessary to ensure that the test signal SC changes its digital logic level is, the greater the resistance of the vessel disposed on the induction surface is and, therefore, bigger is said vessel or the material of said vessel is better for induction. For example, one closure time Ton may be four micro-seconds, the second one eight micro-seconds, and the third one 12 micro-seconds . . . . More or less power may thus be applied depending on the degree of resistivity of the vessel. The process may be repeated as many times as is necessary in order to detect a modification in the test signal SC, with the process coming to an end when said change is detected, or the number of repetitions limited to a predetermined maximum number of times (five, for example), with the process coming to an end when said change is detected or when the predetermined number of times is repeated, according to the circumstances arising beforehand. In this latter case, if no change is detected in the digital logic level of the test signal SC, a maximum or minimum quality or size is determined by default.

When the switch S1 is closed the voltage VN1 is zero volts, with the result that when said switch S1 is opened again said voltage VN1 comprises during several seconds a voltage value lower than the reference value Vref which is associated to the change in the digital logic level of the test signal SC, and the test signal SC comprises the second digital logic level 2N. According to the method of the invention, the test signal SC is evaluated once said voltage VN1 has exceeded said reference value Vref and comprises the first digital logic level 1N. Once the test signal SC comprises said first digital logic level 1N, the presence or not of a vessel is determined at the end of a waiting time Te, it being evaluated during said waiting time Te if the digital logic level of the test signal SC has changed or not. The presence or absence of a vessel may be determined at the end of the waiting time Te, although preferably the presence of a vessel is determined at the end of said waiting time Te and the absence of a vessel at the same time as the digital logic level of the test signal SC changes, without waiting for the waiting time Te to end. The only condition applying to the duration of the waiting time Te is that it must be greater than a minimum time Tmin required by the voltage VN1 to reach the reference value Vref in the event that there is no vessel, shown in FIG. 3*a*. Any desired waiting time Te may be predetermined provided that it is greater than said minimum time. This ensures that in the event of the absence of a vessel the test signal SC changes digital logic level. The waiting time Te starts preferably, as shown in FIG. 3*a*, at the moment at which the voltage VN1 exceeds the reference value Vref (when the test signal SC moves from the second digital logic level 2N to the first digital logic level 1N), but it may also start at the moment at which the switch S1 is opened. In this latter case, the change in the digital logic level contemplated in order to determine that there is no vessel disposed on the induction surface would be the change from the first digital logic level 1N to the second digital logic level 2N, the change from said second digital logic level 2N to said first digital logic level 1N not being taken into account.

The induction apparatus of the invention comprises control means 1 adapted to cause the opening and closure of the switch S1 when required. In addition, the test signal SC preferably communicates with said control means 1, said control means 1 being the means that determine whether the digital logic level of said test signal SC changes during the waiting time Te or not, and the means that determine whether a vessel is disposed on the induction surface of the apparatus or not. It is clear that the apparatus 100 may comprise additional control means (not shown in the figures) which receives the test signal SC, which are adapted to be the means that determine the presence or not of a vessel on the induction surface instead of the control means 1 that are adapted to cause the opening and closure of the switch S1.

The control means 1 comprise a control device such as a micro-processor, a micro-controller or equivalent device, and the times Ton and Te are preferably generated by means of timers pre-programmed by the manufacturer in said control means 1. When the control means 1 are adapted to determine that there is no vessel disposed on the induction surface of the apparatus at the same time as the test signal SC changes its digital logic level, without waiting for the waiting time Te to end, the control means 1 used comprise at least one interruption pin, the test signal SC being connected to said interruption pin. Said interruption pin is associated to the timer of the waiting time Te, and if there is no vessel, when the test signal SC changes level, as said test signal SC is connected to a interruption pin, the edge F produced by said change causes the timer to stop counting, said control means 1 determining the absence of the vessel at that instant.

Figure 4:
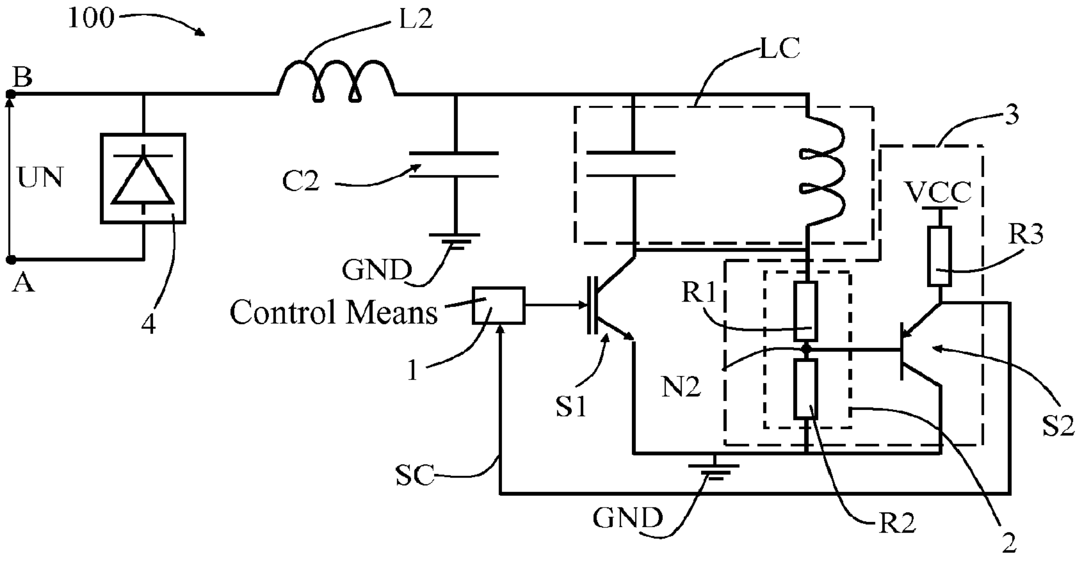
FIG. 4 shows a test signal generator of the circuit of FIG. 1.

The induction apparatus of the invention also comprises a generator 3 for generating the test signal SC. Said generator 3 comprises a second switch S2 that is opened when the voltage VN1 in the intermediate node N1 is greater than the reference value Vref, the test signal SC being associated to the first digital logic level 1N with the second switch S2 in this open position, and which is closed when said voltage VN1 is smaller than said reference value Vref, the test signal SC being associated to the second digital logic level 2N with the second switch S2 in this closed position. FIG. 4 shows a preferred embodiment of the generator 3 of the induction apparatus, which comprises a voltage divider 2 parallel to the switch S1, formed by a first resistance R1 and a second resistance R2 disposed in series, with the reference value Vref for the change of the digital logic level of the test signal SC depending on the value of both resistances R1 and R2. In the preferred embodiment, the second switch S2 corresponds with a PNP bipolar transistor, the base of which is connected to a second node N2 between both resistances R1 and R2, the collector of which is connected to the reference voltage GND, and the emitter of which is connected to a supply voltage VCC, preferably approximately equal to five volts, by means of a third resistance R3, the test signal SC being connected to said emitter. Thus, in said preferred embodiment, when the test signal SC is connected to the digital logic level 2N (the voltage VN1 is smaller than the reference value Vref), a current flows between the emitter and the base of the PNP bipolar transistor, and the test signal SC comprises a logic zero. On the other hand, when the test signal SC is connected to the first digital logic level 1N (the voltage VN1 is greater than the reference value Vref), no current flows between the emitter and the base of the PNP bipolar transistor and the test signal SC comprises a logic one due to the connection of the emitter to the supply voltage VCC. In the preferred embodiment, therefore, the change of level moves from a logic one (the first digital logic level 1N) to a logic zero (the second digital logic level 2N), and if the control means 1 detect the change in level by means of an edge F, said edge F is a falling edge.

What is claimed is:

1. A control method for an induction apparatus having at least one induction coil, at least one capacitor connected in parallel with the induction coil, the induction coil and the capacitor forming a parallel resonant circuit, and at least one switch connected in series with the parallel resonant circuit, between the parallel resonant circuit and a reference voltage, the method comprising:

generating a digital test signal dependent on the voltage present in an intermediate node disposed between the switch and the parallel resonant circuit, the test signal comprising a first digital logic level when the voltage in the intermediate node is greater than a predetermined reference value and a second digital logic level when the voltage is smaller than the predetermined reference value, closing the switch for a first closure time, opening the switch at the end of the first closure time, evaluating the test signal for a waiting time when the switch is open to determine the presence or absence of a vessel on the induction coil, determining the presence of a vessel on the induction coil if during the waiting time the test signal maintains its digital logic level or determining the absence of a vessel on the induction coil if during the waiting time the test signal does not maintain its digital logic level, and closing the switch for a second closure time greater than the first closure time upon determining the presence of a vessel on the induction coil, reopening the switch and evaluating the test signal to determine if the test signal digital logic level changes during a waiting time, and repeating the switch closing, switch opening, and test signal evaluation steps using incrementally greater closure times until a change in the digital logic level of the test signal is detected and using the closure time that results in the change in the digital logic level of the test signal to determine the resistance of the vessel disposed on the induction coil.

2. A method according to claim 1, wherein it is determined that the digital logic level of the test signal is maintained if, at the end of the waiting time, the test signal comprises the first digital logic level.

3. A method according to claim 2, wherein the first digital logic level corresponds with a logic one, and the second digital logic level corresponds with a logic zero.

4. A method according to claim 1, wherein it is determined that the digital logic level of the test signal is maintained if no falling edge in the test signal is detected during the waiting time.

5. A method according to claim 1, wherein the waiting time is greater than a minimum time necessary for the voltage in the intermediate node disposed between the switch and the parallel resonant circuit to change from the first digital logic level to the second digital logic level.

6. A method according to claim 5, wherein the first digital logic level corresponds with a logic one, and the second digital logic level corresponds with a logic zero.

7. A method according to claim 1, further comprising closing the switch for a second closure time greater than the first closure time upon determining the presence of a vessel on the induction coil, reopening the switch and evaluating the test signal to determine if the test signal digital logic level changes during a waiting time, and repeating a predetermined maximum number of times the switch closing, switch opening, and test signal evaluation steps using incrementally greater closure times.

8. A method according to claim 7, wherein the resistance of the vessel disposed on the induction coil is determined by the closure times.

9. An apparatus comprising at least one induction coil, at least one capacitor connected in parallel with the induction coil to form a parallel resonant circuit, at least one switch connected in series with the parallel resonant circuit, between the parallel resonant circuit and a reference voltage, and a controller adapted to open and close the switch, the controller comprising a generator for generating a digital test signal having a first digital logic level when the voltage in an intermediate node disposed between the switch and the parallel resonant circuit is greater than a predetermined reference value and having a second digital logic level when the voltage in the intermediate node is smaller than the reference value, the controller adapted to close the switch during a predetermined closure time, to open the switch at the end of the closure time, and, with the switch open, to evaluate the test signal in order to determine the presence or absence of a vessel on the induction coil during a maximum predetermined waiting time, the controller determining the presence of a vessel on the induction coil if during the waiting time the test signal maintains its digital logic level, wherein upon determining the presence of a vessel on the induction coil, the controller is adapted to repeat the process of closing the switch during a closure time interval greater than a preceding closure time interval, opening the switch at the end of the closure time interval, and to evaluate the test signal to determine whether it has changed its digital logic level during a waiting time, the controller adapted to determining the size and/or quality of the vessel in accordance with the closure time necessary for the test signal to change its digital logic level.

10. An apparatus according to claim 9, wherein the generator comprises a second switch that is adapted to be opened when a voltage in the intermediate node is greater than the reference value and which is adapted to be closed when the voltage is smaller than the reference value.

11. An apparatus according to claim 10, wherein the generator comprises a voltage divider formed by two resistances in series disposed in parallel with the switch, the second switch comprising a PNP bipolar transistor, and its base being connected to the second node disposed between both resistances, its collector connected to the second digital logic level, and its emitter connected to the first digital logic level.

12. An apparatus according to claim 9, wherein the first digital logic level corresponds with a supply voltage comprising a logic one, and the second digital logic level corresponds with the reference voltage comprising a logic zero.

13. An apparatus according to claim 9, wherein the switch is an IGBT.

14. An apparatus comprising at least one induction coil, at least one capacitor connected in parallel with the induction coil to form a parallel resonant circuit, at least one switch connected in series with the parallel resonant circuit, between the parallel resonant circuit and a reference voltage, and a controller adapted to open and close the switch, the controller comprising a generator for generating a digital test signal having a first digital logic level when the voltage in an intermediate node disposed between the switch and the parallel resonant circuit is greater than a predetermined reference value and having a second digital logic level when the voltage in the intermediate node is smaller than the reference value, the controller adapted to close the switch during a predetermined closure time, to open the switch at the end of the closure time, and, with the switch open, to evaluate the test signal in order to determine the presence or absence of a vessel on the induction coil during a maximum predetermined waiting time, the controller determining the presence of a vessel on the induction coil if during the waiting time the test signal maintains its digital logic level, wherein upon determining the presence of a vessel on the induction coil, the controller is adapted to repeat for a predetermined maximum number of times the process of closing the switch during a closure time interval greater than the preceding closure time interval, opening the switch at the end of the corresponding closure time, and, with the switch opened, to evaluate the test signal to determine whether the test signal changes its digital logic level during a waiting time.

15. An apparatus according to claim 14, wherein the controller is adapted to determine the size and/or quality of the vessel in accordance with the closure time interval necessary for the test signal to change its digital logic level.

16. An apparatus according to claim 14, wherein the generator comprises a second switch that is adapted to be opened when a voltage in the intermediate node is greater than the reference value and which is adapted to be closed when the voltage is smaller than the reference value.

17. An apparatus according to claim 16, wherein the generator comprises a voltage divider formed by two resistances in series disposed in parallel with the switch, the second switch comprising a PNP bipolar transistor, and its base being connected to the second node disposed between both resistances, its collector connected to the second digital logic level, and its emitter connected to the first digital logic level.

18. An apparatus according to claim 14, wherein the first digital logic level corresponds with a supply voltage comprising a logic one, and the second digital logic level corresponds with the reference voltage comprising a logic zero.

19. An apparatus according to claim 14, wherein the switch is an IGBT.

* * * * *